United States Patent
McCormick et al.

(10) Patent No.: US 6,611,096 B1
(45) Date of Patent: Aug. 26, 2003

(54) ORGANIC ELECTRONIC DEVICES HAVING CONDUCTING SELF-DOPED POLYMER BUFFER LAYERS

(75) Inventors: Fred Boyle McCormick, Maplewood, MN (US); Michael Albert Haase, Saint Paul, MN (US); Paul Frederic Baude, Maplewood, MN (US); Yong Hsu, Woodbury, MN (US); George David Vernstrom, Saint Paul, MN (US); Manoj Nirmal, Saint Paul, MN (US); Russell Dean Birkholz, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/390,088

(22) Filed: Sep. 3, 1999

(51) Int. Cl.[7] .................................. H05B 33/00
(52) U.S. Cl. .................. 313/506; 313/509; 313/512; 428/917
(58) Field of Search ................. 313/506, 504, 313/503, 509, 512; 257/102; 428/917

(56) References Cited

U.S. PATENT DOCUMENTS

| | | | |
|---|---|---|---|
| 5,061,569 A | 10/1991 | VanSlyke et al. | 428/457 |
| 5,093,439 A | 3/1992 | Epstein et al. | 525/540 |
| 5,232,631 A | 8/1993 | Cao et al. | 252/500 |
| 5,310,781 A | 5/1994 | Wudl et al. | 524/599 |
| 5,563,424 A | 10/1996 | Yang et al. | 257/40 |
| 5,574,291 A | 11/1996 | Dodabalapur et al. | 257/40 |
| 5,596,208 A | 1/1997 | Dodabalapur et al. | 257/66 |
| 5,641,859 A | 6/1997 | Chen et al. | 528/422 |
| 5,707,745 A | 1/1998 | Forrest et al. | 428/432 |
| 5,719,467 A | 2/1998 | Antoniadis et al. | 313/506 |
| 5,723,873 A | 3/1998 | Yang | 257/40 |
| 5,747,182 A | 5/1998 | Friend et al. | 428/690 |
| 5,747,183 A | 5/1998 | Shi et al. | 428/690 |
| 5,759,637 A | 6/1998 | Angelopoulos et al. | 427/504 |
| 5,773,929 A | 6/1998 | Shi et al. | 313/504 |
| 5,798,170 A | 8/1998 | Zhang et al. | 428/212 |
| 5,807,627 A | 9/1998 | Friend et al. | 428/212 |
| 5,853,794 A | 12/1998 | Melody et al. | 427/58 |
| 5,863,981 A | 1/1999 | Wudl et al. | 524/609 |
| 5,888,582 A | 3/1999 | Kinard et al. | 427/79 |
| 5,891,968 A | 4/1999 | Wudl et al. | 525/417 |
| 5,902,677 A | 5/1999 | Shi et al. | 428/332 |
| 5,910,385 A | 6/1999 | Gardner et al. | 430/62 |
| 5,932,363 A | 8/1999 | Hu et al. | 428/690 |
| 5,965,281 A | 10/1999 | Cao | 428/690 |
| 5,965,979 A | 10/1999 | Friend et al. | 313/504 |

FOREIGN PATENT DOCUMENTS

| | | |
|---|---|---|
| EP | 0 443 861 A | 8/1991 |
| EP | 0 700 917 A2 | 3/1996 |
| EP | 0 869 701 A2 | 10/1998 |
| EP | 0 869 701 A3 | 10/1998 |
| WO | WO 95/24056 A | 9/1995 |
| WO | WO 96/37001 A | 11/1996 |
| WO | WO 98/01909 A | 1/1998 |
| WO | WO 98/05187 | 2/1998 |
| WO | WO 98/41065 A | 9/1998 |
| WO | WO 99/13692 A | 3/1999 |
| WO | WO 99/54385 | 10/1999 |

OTHER PUBLICATIONS

C.H. Chen, J. Shi, and C.W. Tang "Recent Developments in Molecular Organic Electroluminescent Materials", *Macromolecular Symposia*, 1997, 125, pp 1–48.

(List continued on next page.)

*Primary Examiner*—Ashok Patel
(74) *Attorney, Agent, or Firm*—Melanie Gover (57) ABSTRACT

Organic electronic devices having a conducting self-doped polymer buffer layer, particularly a self-doped polyaniline buffer layer, are described. Also described are organic light emitting diodes with buffer layers comprised of an intrinsically conducting polymer having no mobile counterions.

10 Claims, 2 Drawing Sheets

OTHER PUBLICATIONS

J. Kido, "Organic Electroluminescent Devices Based on Polymeric Materials", *Trends in Polymer Science,* Oct. 1994, vol. 2, No. 10, pp. 350–355.

J.J.M. Halls, D. R. Baigent, F. Cacialli, N.C. Greenham, R.H. Friend, S.C. Moratti, and A. B. Holmes, "Light–Emitting and Photoconductive Diodes Fabricated with Conjugated Polymers", *Thin Solid Films,* 1996, 276, pp. 13–20.

Q. Pei, Y. Yang, G. Yu, C. Zhang, and A. J. Heeger, "Polymer Light–Emitting Electrochemical Cells: In Situ Formation of a Light–Emitting p–n Junction", *Journal of the American Chemical Society,* Jun. 27, 1996, vol. 118, No. 16, pp. 3922–3929.

Z. Shen, P. E. Burrows, V. Bulovic, S. R. Forrest, and M. E. Thompson, "Three–Color, Tunable, Organic Light–Emitting Devices", *Science,* 1997, 276, pp. 2009–2011.

Antoniadas, H., et al., "Failure Modes in Vapor–Deposited Organic LEDs", *Macromol. Symp.,* 125, 1997, pp. 59–67.

Yue, J., Epstein, A., "Synthesis of Self–Doped Conducting Polyaniline", *J. Am. Chem. Soc.,* 1990, 112, pp. 2800–2801.

Gustafsson, G., Cao, Y., Treacy, G. M., Klavetter, F., Colaneri, N., Heeger, A. J.; "Flexible light–emitting diodes made from soluble conducting polymers", *Nature,* vol. 357, Jun. 11, 1992, pp. 477–479.

Ho, Peter K. H., Granstrom, Magnus, Friend, Richard H., and Greenham, Neil C., "Ultrathin Self–Assembled Layers at the ITO Interface to Control Charge Injection and Electroluminescence Efficiency in Polymer Light–Emitting Diodes", *Advanced Materials,* 1998, 10, No. 10, pp. 769–774.

Onada, Mitsuyoshi, and Yoshino, Katsumi, "Unique Electrical Porperties Of Self–Assembled Ultra–Thin Polymer Film", *International Symposium On Electrical Insulating Materials,* 1995, pp. 255–258.

Karg, S., Scott, J. C., Salem, J. R., Angelopoulos, M., "Increased Brightness And Lifetime Of Polymer Light–Emitting Diodes With Polyaniline Anodes", *Synthetic Metals,* 80, (1996) pp. 111–117.

Scott, J. C., Carter, S. A., Karg, S., Angelopoulos, M., "Polymeric Anodes For Organic Light–Emitting Diodes", *Synthetic Metals,* 85 (1997), pp. 1197–1200.

Barbero, Cesar, Miras, Maria C., Schnyder, Bernhard, Haas, Otto, and Kotz, Rudiger, "Sulfonated Polyaniline Films as Cation Insertion Electrodes for Battery Application", *J. Mater. Chem.,* 1994, 4(12), pp. 1775–1783.

Yang, Y., and Heeger, A. J., "Polyaniline As a Transparent Electrode For Polymer Light–Emitting Diodes: Lower Operating Voltage And Higher Efficiency", *Appl. Phys. Lett.* 64 (10), Mar. 7, 1994, pp. 1245–1247.

Onoda, Mitsuyoshi, and Yoshino, Katsumi, "Fabrication of Self–Assembled Multilayer Heterostructure of Poly(p–phenylene vinylene) and Its Use For An Electroluminescent Diode", *J. Appl. Phys.,* 78 (7), Oct. 1, 1995, pp. 4456–4462.

Onoda, Mitsuyoshi, and Yoshino, Katsumi, "Heterostructure Electroluminescent Diodes Prepared from Self–Assembled Multilayers of Poly(p–phenylene vinylene and Sulfonated Polyaniline", *Jpn. J. Appl. Phys,* Vol 34, Part 2, No. 2B (Feb. 15, 1995), pp. L260–L263.

Sheats, James R., Antoniadis, Homer, Hueschen, Mark, Leonard, William, Miller, Jeff, Moon, Ron, Roitman, Daniel, Stocking, Andrew, "Organic Electroluminescent Devices", *Science,* vol. 273, Aug. 16, 1996, pp. 884–888.

Wang, Y. Z., Gebler, D. D., Lin, L. B., Blatchford, J. W., Jessen, S. W., Wang, H. L., Epstein, A. J., "Alternating–Current Light–Emitting Devices Based on Conjugated Polymers", *Appl. Phys. Lett.,* vol. 68, No. 7, Feb. 12, 1996, pp. 894–896.

ORGANIC ELECTRONIC DEVICES HAVING CONDUCTING SELF-DOPED POLYMER BUFFER LAYERS

TECHNICAL FIELD

This invention relates to organic electronic devices and in particular buffer layers for organic light emitting diodes (OLEDs).

BACKGROUND

Organic electronic devices are articles that include layers of organic materials, at least one of which can conduct an electric current. An example of an organic electronic device is an organic light emitting diode (OLED). OLEDs, sometimes referred to as lamps, are desirable for use in electronic media because of their thin profile, low weight, and low driving voltage, i.e., less than about 20 volts. OLEDs have potential use in applications such as backlighting of graphics, pixelated displays, and large emissive graphics.

OLEDs typically consist of an organic light emitter layer and additional organic charge transport layers on both sides of the emitter, all of which are sandwiched between two electrodes: a cathode and an anode. The charge transport layers comprise an electron transporting layer and a hole transporting layer. Charge carriers, i.e., electrons and holes, are injected into the electron and hole transporting layers from the cathode and anode, respectively. Electrons are negatively charged atomic particles and holes are vacant electron energy states that behave as though they are positively charged particles. The charge carriers migrate to the emitter layer, where they combine to emit light.

Figure 1:
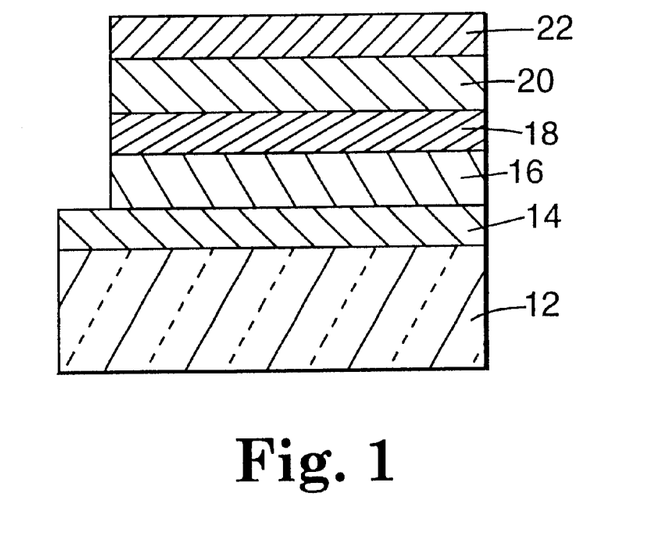
FIG. 1 depicts the general structure of a type of organic light emitting diode.

FIG. 1 illustrates a type of organic light emitting diode. The diode comprises a substrate 12, a first electrode (anode) 14, a hole transporting layer 16, a light emitting layer 18, an electron transporting layer 20, and a second electrode (cathode) 22.

Substrate 12 may be transparent or semi-transparent and may comprise, e.g., glass, or transparent plastics such as polyolefins, polyethersulfones, polycarbonates, polyesters, and polyarylates.

Anode 14 is electrically conductive and may be optically transparent or semi-transparent. Suitable materials for this layer include indium oxide, indium-tin oxide (ITO), zinc oxide, vanadium oxide, zinc-tin oxide, gold, copper, silver, and combinations thereof.

An optional hole injecting layer (not shown) may accept holes from anode 14 and transmit them to hole transporting layer 16. Suitable materials for this layer include porphyrinic compounds, e.g., copper phthalocyanine (CuPc) and zinc phthalocyanine.

Hole transporting layer 16 facilitates the movement of holes from anode layer 14 to emitter layer 18. Suitable materials for this layer include, e.g., aromatic tertiary amine materials described in U.S. Pat. Nos. 5,374,489 and 5,756,224, (both incorporated by reference) such as 4,4',4"-tri(N-phenothiazinyl) triphenylamine (TPTTA), 4,4',4"-tri(N-phenoxazinyl) triphenylamine (TPOTA), N,N'-diphenyl-N,N'-bis(3-methylphenyl)[1,1'-biphenyl]-4,4'-diamine (TPD), and polyvinyl carbazole.

Emitter layer 18 comprises an organic material capable of accommodating both holes and-electrons. In emitter layer 18, the holes and electrons combine to produce light. Suitable materials for this layer include, e.g., tris(8-hydroxyquinolinato)aluminum (AlQ). The emission of light of different colors may be achieved by the use of different emitters and dopants in the emitter layer as described in the art (see C. H. Chen, J. Shi, and C. W. Tang "Recent Developments in Molecular Organic Electroluminescent Materials", *Macromolecular Symposia* 1997 125, 1–48).

Electron transporting layer 20 facilitates the movement of electrons from cathode 22 to emitter layer 18. Suitable materials for this layer include, e.g., AlQ, bis(10-hydroxybenzo(h)quinolinato) beryllium, bis(2-(2-hydroxy-phenyl)-benzolthiazolato) zinc and combinations thereof.

An optional electron injecting layer (not shown) may accept electrons from the cathode 22 and transmit them to the emitter layer 18. Suitable materials for this layer include metal fluorides such as LiF, CsF, as well as $SiO_2$, $Al_2O_3$, copper phthalocyanine (CuPc), and alkaline metal compounds comprising at least one of Li, Rb, Cs, Na, and K such as alkaline metal oxides, alkaline metal salts, e.g., $Li_2O$, $Cs_2O$, and $LiAlO_2$.

Cathode 22 provides electrons. It may be transparent. Suitable materials for this layer include, e.g., Mg, Ca, Ag, Al, alloys of Ca and Mg, and ITO.

Polymer OLEDs may be made wherein a single layer of poly(phenylenevinylene) (PPV) or poly(2-methoxy-5-(2'-ethylhexyloxy)-1,4-phenylene vinylene) (MEH-PPV) functions as layers 16, 18, and 20.

Illustrative examples of known OEL device constructions would include molecularly doped polymer devices where charge carrying and/or emitting species are dispersed in-a polymer matrix (see J. Kido, "Organic Electroluminescent devices Based on Polymeric Materials," *Trends in Polymer Science*, 1994, 2, 350–355), conjugated polymer devices where layers of polymers such as poly(phenylenevinylene) (PPV) act as the charge carrying and emitting species (see J. J. M. Halls, D. R. Baigent, F. Cacialli, N. C. Greenham, R. H. Friend, S. C. Moratti, and A. B. Holmes, "Light-emitting and Photoconductive Diodes Fabricated with Conjugated Polymers," *Thin Solid Films*, 1996, 276, 13–20), vapor deposited small molecule heterostructure devices (see U.S. Pat. No. 5,061,569, incorporated by reference, and C. H. Chen, J. Shi, and C. W. Tang, "Recent Developments in Molecular Organic Electroluminescent Materials," *Macromolecular Symposia*, 1997, 125, 1–48), light emitting electrochemical cells (see Q. Pei, Y. Yang, G. Yu, C. Zhang, and A. J. Heeger, "Polymer Light-Emitting Electrochemical Cells: In Situ Formation of a Light-Emitting p-n Junction," *Journal of the American Chemical Society*, 1996, 118, 3922–3929), and vertically stacked organic light-emitting diodes capable of emitting light of multiple wavelengths (see U.S. Pat. No. 5,707,745, incorporated by reference and Z. Shen, P. E. Burrows, V. Bulovic, S. R. Forrest, and M. E. Thompson "Three-Color, Tunable, Organic Light-Emitting Devices," *Science*, 1997, 276, 2009–2011).

SUMMARY OF INVENTION

The present invention relates to adding a buffer layer, comprising a self-doped polymer, adjacent to an electrode layer in an organic electronic device. The invention further relates to adding a buffer layer, comprising an intrinsically conducting polymer having no mobile counterions, adjacent to an electrode layer in a small molecule, molecularly doped polymer, or conjugated polymer organic light emitting diode. For example, a buffer layer may be added between the anode layer and hole transporting layer of an organic electronic device to increase performance reliability. A buffer layer could also be added between a substrate and cathode layer.

When the buffer layer of the present invention is used in an organic electronic device such as an organic light emitting diode (OLED), the benefits to performance reliability include reducing or eliminating performance failures such as electrical shorts and non-radiative regions (dark spots). Typical performance failures are described in Antoniadas, H., et al., "Failure Modes in Vapor-Deposited Organic LEDs," Macromol. Symp., 125, 59–67 (1997). The performance reliability of OLEDs can be influenced by a number of factors. For example, defects in, particles on, and general variations in the morphology at the surface of the materials comprising the substrate and electrode layers can cause or exacerbate performance failures that can occur in OLEDs. Particles or defects on the surface of the substrate or electrode layer may prevent the electrode surface from being coated uniformly during the deposition process. This can cause shadowed regions close to the particle or defect. Shadowed areas provide pathways for water, oxygen, and other detrimental agents to come into contact with and degrade the various lamp layers. This degradation can lead to dark spots which can grow into larger and larger non-emissive regions. This degradation can lead to immediate device failure due to electrical shorting or slower, indirect failure caused by interaction of the OLED layers with the atmosphere. The planarization provided by a conformal buffer layer can mitigate these imperfections.

Adding a buffer layer comprising an externally-doped polymer to an organic electronic device can cause an undesirable increase in operating voltage over time. This phenomenon is shown in U.S. Pat. No. 5,719,467, FIG. 5, incorporated by reference. However, the present inventors discovered that using a conducting self-doped polymer instead of an externally-doped polymer in the buffer layer does not increase the operating voltage, while still providing the benefits of a buffer layer.

One aspect of the invention features an organic electronic device having a buffer layer comprised of a self-doped conducting polymer, preferably a self-doped conductive polyaniline such as a conductive polyaniline incorporating sulfonic acid groups in the backbone.

The organic electronic device may be an organic light emitting diode (OLED). The OLED may have a transparent, semi-transparent, or opaque anode and/or cathode layer, depending on the desired direction of light emission from the OLED. Other aspects of the present invention feature a small-molecule, molecularly doped polymer, or conjugated polymer organic light emitting diode comprising a transparent or semitransparent electrode layer adjacent to a buffer layer comprising an intrinsically conducting polymer having no mobile counterions.

The intrinsically conducting polymer may be, e.g., polypyrrole, polyaniline, polythiophene, polyacetylene, and their derivatives.

As used in this specification:

"dopant" means an additive used to modify the electrical conductivity of a polymer; for example, the imine nitrogen of a polyaniline molecule in its base form may be protonated upon exposure of the polyaniline to an acidic solution thereby converting the polyaniline to its conducting form; the acid providing the proton may be referred to as the dopant;

"externally doped" means a polymer is exposed to an added substance that can change the polymer's electrical conductivity; for example, an acidic solution can provide a hydrogen ion to dope a polyaniline molecule and can concurrently provide a counterion that is ionically, but not covalently, bonded to the polymer molecule;

"self-doped" means that the doping moiety is covalently bonded to the polymer being doped;

"intrinsically conducting" means an organic polymer that contains polyconjugated bond systems and that can act as an electrical conductor in the absence of external conductive materials such as metal particles, carbon black, etc.;

"small-molecule OLED" means a multilayer heterostructure OLED having its non-polymer layers vapor deposited onto an electrode substrate in a vacuum chamber, wherein "non-polymer" refers to low molecular weight discrete compounds that can be thermally vaporized without causing significant decomposition or other chemical changes; and "polymer light emitting device" can include a molecularly doped polymer, conjugated polymer, or hybrid OLEDs, e.g., AlQ vapor deposited on top of solution coated PPV.

An advantage of at least one embodiment of the present invention is the reduction or elimination of mobile counterions in an organic electronic device. Preferably, counterion mobility is reduced or eliminated in the buffer layer of such a device. It is advantageous to immobilize these counterions because it is believed that they can migrate in the electrode structure and interfere with the movement of positive charges or electrons in the device.

Another advantage of at least one embodiment of the present invention is the avoidance of undesirable operating voltage increase over time.

Another advantage of at least one embodiment of the present invention is increased device lifetime and higher operating reliability.

DETAILED DESCRIPTION

Figure 2:
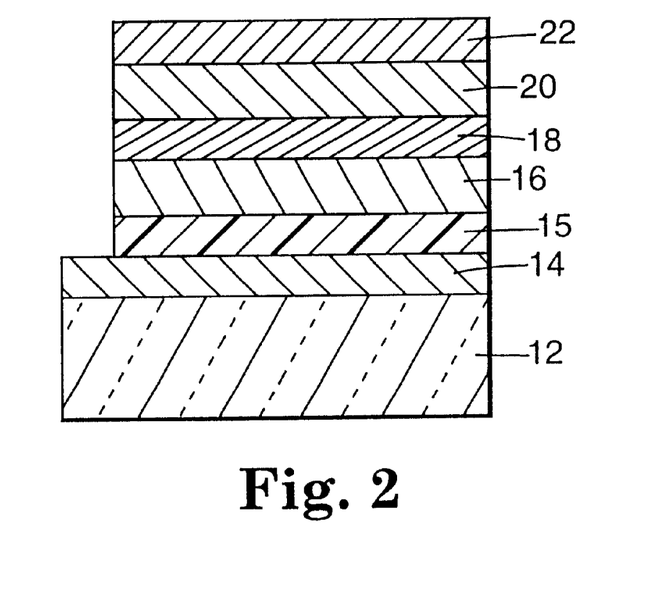
FIG. 2 depicts the OLED of FIG. 1 with the buffer layer of the present invention.

FIG. 2 illustrates an OLED structure comprising the OLED of FIG. 1 with buffer layer 15 of the present invention. In this embodiment, the buffer layer of the present invention is between the anode layer and hole transporting layer. However, the buffer layer may also be added adjacent a cathode layer, e.g., between the cathode and electron transporting layer. The present invention recognizes that when an externally-doped polymer is used in a buffer layer of an organic electronic device, an undesirable operating voltage increase may be observed in the operation of the device over time at a constant current density. The invention further recognizes that by using a conducting self-doped polymer in a buffer layer, the advantages of a buffer layer can be obtained without the operating voltage increase associated with the use of an externally doped polymer.

It is believed that the superior performance achieved with a conducting self-doped polymer is due to the absence of the mobile counterions required for an externally doped polymer to conduct an electrical charge. When a polymer is externally doped the counterions present in the device are ionically, but not covalently, bonded to the doped polymer. It is believed that the counterions are mobile and that when the device is subjected to an electric field, these counterions can migrate, or drift. This can impede the movement of electrons and holes as the device operates over time. With a self-doped polymer, the functionalities that dope the polymer into its conductive form are covalently bonded to the polymer. Accordingly, there are no mobile counterions that can migrate and impede movement of electrons and holes.

polymers include those that may be prepared as described in U.S. Pat. Nos. 5,310,781, 5,641,859, 5,863,981, and 5,891,968, each of which is incorporated by reference. Self-doped polyanilines are preferred. Polyanilines self-doped with sulfonic acid groups are most preferred. Self-doped sulfonated polyanilines may also be made according to the methods described in U.S. Pat. No. 5,093,439, incorporated by reference, and Yue, J., Epstein, A., "Synthesis of Self-Doped Conducting Polyaniline" *J. Am. Chem. Soc.*, 1990, 112, 2800–2801. Blends of self-doped conductive polymers and other polymers such as insulating polymers can also be used as a buffer layer. For example, aqueous polyaniline may be blended with polyvinyl alcohol, polyethylene oxide (PEO), poly(vinyl methyl ether) (PVME), poly(ethylene imine) (PEI), poly(acrylic acid) (PAA) and other polymers such as those listed in U.S. Pat. No. 5,641,859 (incorporated by reference), Col. 5, beginning at line 15.

The insulating emeraldine base form of polyaniline (Formula I showing the repeat units) may be used to make conducting, externally acid-doped emeraldine salt polyaniline (Formula II showing the repeat unit) as follows:

The buffer layer may comprise any type of conducting polymer such as an intrinsically conducting polymer as long as it has no mobile counterions. Suitable intrinsically conducting polymers that may form the backbone of self-doped conducting polymers having no mobile counterions include polyanilines, poly(phenylenevinylene)s, polythiophenes, polyisothianaphthenes, poly(p-phenylene)s, poly(p-phenylene sulfide)s, poly(m-phenylene)s, polyacetylenes, polycarbazoles, polypyrroles, and derivatives, blends, and hybrids of these polymers. Suitable conducting self-doped where X⁻ is a mobile counterion.

A 50% self-doped sulfonated polyaniline may have the following structure (Formula III showing the repeat unit):

A 100% self-doped sulfonated polyaniline may have the following structure (Formula IV showing the repeat unit):

IV

Although sulfonic acid groups are typically used to self-dope a polymer, other groups may be used. The doping substituent preferably is an acid strong enough to provide a hydrogen cation to dope an intrinsically conducting polymer. Suitable groups include, for example, perfluoroacids, carboxylic acid, phosphoric acid, sulfonic acid, phosphonic acid, and the like.

Self-doping a polymer is typically achieved by substitution on the carbon backbone of the molecule. However, self-doping may also be achieved by substitution at other sites. For example, it is possible to substitute on the imine nitrogen of a polyaniline molecule, e.g., as described in U.S. Pat. No. 5,641,859, incorporated by reference. A self-doped (N-alkylated) polyaniline may have the following structure (Formula V showing the repeat unit):

V

Figure 3:
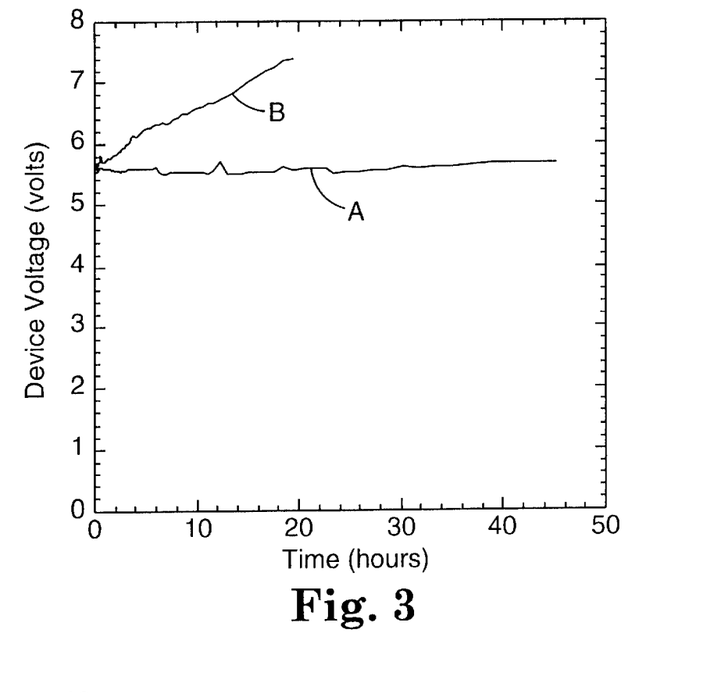
FIG. 3 shows the operating voltage increase over the lifetimes of two OLED devices at a constant current density. The A device has no buffer layer and the B device has a buffer layer comprising externally-doped polyaniline.
Figure 4:
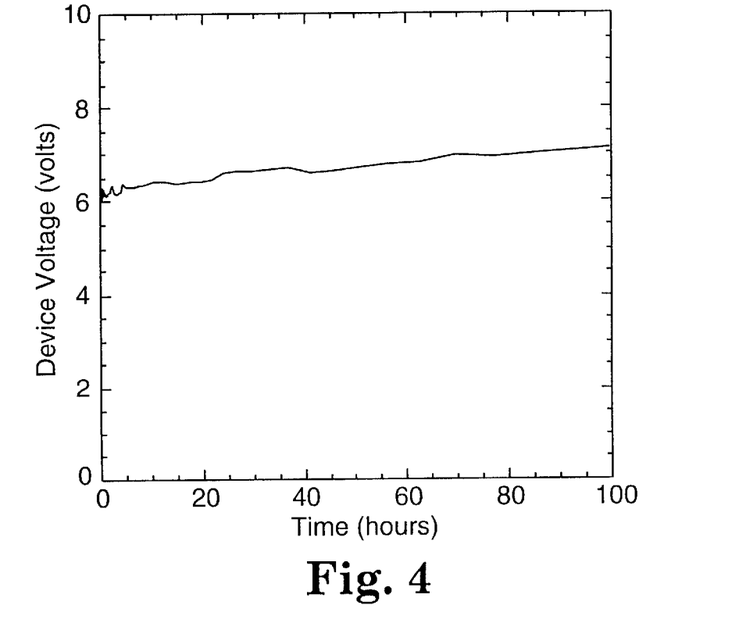
FIG. 4 shows the operating voltage increase over the lifetime of an OLED device at a constant current density. The OLED device has a buffer layer comprising self-doped polyaniline.

As shown in FIG. 3, when an externally doped polymer (polyaniline containing sulfonic acid dopant, obtained as an experimental sample from Monsanto Chemical Co., St. Louis, Mo.) was used as a buffer layer on an anode-coated substrate in an operating OLED, the voltage increased from about 5.6 to 7.4 volts over about 20 hours at a constant current density of 20 milliAmps/square centimeter (mA/$cm^2$). FIG. 3 also shows that a similar device having no buffer layer did not exhibit the same voltage increase. The OLED having no buffer layer showed no voltage increase during the initial 20 hours of operation, and an increase from about 5.5 to about 5.7 volts during 45 hours of operation at a constant current density of 20 mA/$cm^2$. This data suggests that the voltage increase is caused by the externally-doped polymer buffer layer. FIG. 4 shows that a device of the invention having a buffer layer comprising a conducting self-doped polymer (water-soluble sulfonated self-doped polyaniline obtained from Aldrich) instead of an externally doped polymer did not have a substantial voltage increase over time, and, in fact, had a voltage profile comparable to that of a device having no buffer layer. The OLED comprising a self-doped polymer buffer layer showed a voltage increase from about 6.3 to 6.5 volts during the initial 20 hours of operation, from about 6.3 to 6.6 volts during 45 hours of operation, and an increase from about 6.3 to 7.2 volts during 100 hours of operation, at a constant current density of 20 mA/$cm^2$. Accordingly, the present invention provides the advantages of a buffer layer without the disadvantages of an externally-doped polymer buffer layer.

The buffer layer material may be applied to an electrode layer using any coating method known in the art, such as spin coating, gravure coating, meniscus coating, spraying, dipping, bar coating, knife coating, curtain coating, kiss coating, air blade coating, extrusion coating, slide coating, slot coating, electrostatic coating, roll coating, flexographic printing, and combinations of these methods. The buffer layer may be deposited in an aqueous or organic solution, depending on its solubilities. To ensure that the buffer layer is well-adhered to the electrode layer, the electrode layer may be pre-treated to make it sufficiently hydrophilic to be wetted by an aqueous solution or sufficiently hydrophobic to be wetted by an organic solution. Methods of treating the electrode layer include treating the surface with $O_2$ plasma, applying hydrofluoric acid, or applying solutions containing a strong base such as sodium hydroxide or tetramethyl ammonium hydroxide. A combination of surface treatments may be used.

Suitable solvents for preparing a coatable solution include aqueous sodium hydroxide or ammonium hydroxide solutions. Ammonium hydroxide is preferred, especially when making electrical devices comprising self-doped polyaniline. When sodium hydroxide is used, evaporative drying leaves sodium ions in the polymer coating. The sodium ion is a mobile counterion that can migrate and interfere with the movement of charge carriers, as previously discussed. When ammonium hydroxide is used, ammonia molecules evaporate as the coating dries, leaving protons to dope the conducting polymer without the presence of a mobile counterion. Any excess ammonium hydroxide evaporates as ammonia and water.

After the buffer layer has been applied, it should be dried to remove the coating solvent (e.g., water). The buffer layer may be dried by exposure to ambient conditions. Faster drying times may be achieved by spin drying, applying heat, applying inert gas, or applying a vacuum.

The buffer-coated substrate may then be further processed, for example, to make an OLED, such as those described in U.S. Pat. Nos. 5,747,182 and 5,747,183, both incorporated by reference. Although OLED substrates adjacent the anode layer are typically transparent or semi-transparent, they may be opaque if the materials comprising the OLED allow light emission through the cathode end of the device. The OLED may be small-molecule, conjugated polymer, or molecularly doped polymer. The buffer-coated substrate may also be used in organic transistors, such as those described in U.S. Pat. Nos. 5,574,291 and 5,596,208, both incorporated by reference.

This invention may be illustrated by way of the following examples.

EXAMPLES

Unless otherwise specified, all chemicals were obtained from Aldrich Chemicals, Milwaukee, Wis.

The inventors prepared the following examples using a 75% sulfonated polyaniline obtained from Aldrich. This sulfonated polyaniline is no longer commercially available, but a 100% sulfonated polyaniline may be obtained from Mitsubishi-Rayon Co., Ltd., Tokyo, Japan. Fifty percent sulfonation provides a fully doped polymer. Additional sulfonation aids solubility.

Tris(8-hydroxyquinolinato)aluminum (AlQ) was obtained from Dojindo Laboratories, Kumamoto, Japan. Glass substrates coated with indium-tin oxide (ITO) have nominal sheet resistance of 10–100 ohm/square and ITO thickness of 300–1500 Å.

Vacuum deposition for preparation of an OLED was carried out in an evaporator vacuum chamber equipped with an oil diffusion pump to operate at a base pressure of 10 $\mu$Torr and six evaporant sources that were heated by resistive heating. Deposition rates were monitored using an oscillating-crystal thickness monitor (Inficon XTC/2, Leybold Inficon, East Syracuse, N.Y.). The substrate was nominally kept at 23° C.

Comparative Example 1

OLED With Externally-doped Polyaniline on Glass Substrate

An ITO-coated glass substrate, 5 cm×7.6 cm×1 mm (Thin Film Devices, Inc., Anaheim, Calif.) was rinsed with methanol and dried under a nitrogen flow, then placed in a spin-coater, covered with xylene, and spun dry. A xylene solution of sulfonic-acid doped polyaniline (5% solids by weight, non-commercial sample supplied by Monsanto Co., St. Louis, Mo.) was applied through a 0.2 $\mu$m TEFLON filter (Gelman Sciences, Ann Arbor, Mich.) to cover the slide. The slide was spun at 5000 rpm for 20 seconds to give a polyaniline film approximately 500 Å thick. The coated slide was immediately placed in an evaporator vacuum chamber and the chamber was sealed and evacuated to approximately $10^{-6}$ torr. A light-emitting construction was prepared on the polyaniline surface by vacuum deposition, in the following order, of: 100 Å layer of copper phthalocyanine (CuPc), at 1 Å/sec; 400 Å N,N'-bis(3-methylphenly)-N,N'-diphenylbenzidine (TPD) hole transport layer, at 3 Å/sec; 400 Å AlQ electron transport layer, at 2 Å/sec; 10 Å lithium fluoride, at 1 Å/sec; 300 Å aluminum, at 10 Å/sec; and 1000 Å gold, at 10 Å/sec. On removal from the chamber, the device was connected to an electrical source and operated at 20 mA/cm2 at an applied voltage of 5.53 V. Light was emitted with an external quantum efficiency (QE) of 0.91%. The light output intensity of the device was 540 candela/m$^2$ (cd/m$^2$) as measured by a United Photodetectors model #PIN-10D silicon photodetector (UDT Sensors, Hawthorne, Calif.). The electroluminescence emission spectrum of the lamp was identical to the photoluminescence spectrum of AlQ, as measured using a calibrated SD 1000 fiber optic spectrometer (Ocean Optics, Inc., Dunedin, Fla.).

Results of a lifetime study of this device, showing the effect of operating time on voltage is shown in FIG. 3 as the curve for device B.

Comparative Example 2

OLED Without Polyaniline

An OLED device was prepared as described in Comparative Example 1, except that no xylene was spun dry on the substrate and no doped polyaniline layer was applied. On removal from the chamber, the device was connected to an electrical source and operated at 20 mA/cm2 at an applied voltage of 5.5 V. Light was emitted with an external quantum efficiency (QE) of 0.84%. The light output intensity of the device was 503 candela/m$^2$ (cd/m$^2$).

Results of a lifetime study of this device, showing the effect of operating time on voltage is shown in FIG. 3 as the curve for device A. A comparison of the data for Comparative Examples 1 and 2 in FIG. 3 shows that a device constructed using externally-doped polyaniline exhibits a significantly greater voltage increase relative to a device constructed without using doped polyaniline.

Example 1

OLED With Self-doped Polyaniline

An OLED device was constructed according to the method of Comparative Example 1, except the substrate was treated with an oxygen plasma for 4 minutes at 50 Watts and 200 millitorr of oxygen in a reactive ion etcher (Micro-RIE series 80, Technics, Inc., Dublin, Calif.) and a 600 Å layer of self-doped water soluble polyaniline (Aldrich) was used in place of the externally doped polyaniline. The self-doped polyaniline was coated from a 5 weight % aqueous ammonia solution. In this construction, after spin coating of the self-doped polyaniline layer, the glass substrate was heated on a hotplate at 125° C for 10 minutes to remove traces of water and ammonia. Then the remaining layers were added as described in Comparative Example 1. The device was operated at 20 mA/cm$^2$ for 100 hours, during which the device exhibited an operating voltage increase from about 6.3 V to about 7.2 V with a corresponding drop in photocurrent from about 53 $\mu$A to about 22 $\mu$A. Light was emitted at approximately 0.79% QE, corresponding to a brightness of 470 cd/m$^2$. A lifetime study of this device, showing the effect of operating time on operating voltage is shown in FIG. 4.

A comparison of FIGS. 3 and 4 shows that a device constructed with self-doped polyaniline (FIG. 4) exhibits a significantly smaller operating voltage increase relative to a device constructed with externally-doped polyaniline (FIG. 3, device B).

Other embodiments of the invention are within the scope of the following claims.

What is claimed is:

1. A small molecule organic electronic device comprising:

an electrode layer adjacent to a buffer layer comprising a conducting self-doped polymer, and a layer consisting essentially of non-polymeric small molecule material adjacent the buffer layer.

2. The organic electronic device of claim 1 wherein the conducting self-doped polymer comprises self-doped polyaniline.

3. The organic electronic device of claim 1 wherein the conducting self-doped polymer is sulfonated polyaniline.

4. The organic electronic device of claim 1 wherein the device exhibits a voltage increase of less than 15% over a period of 100 hours of operation at a constant density current.

5. A small-molecule organic light emitting diode comprising an anode layer, a single buffer layer comprising an intrinsically conducting polymer having no mobile counterions, wherein the anode layer is adjacent one side of the buffer layer and a layer consisting essentially of non-polymeric small molecule material is adjacent the other side of the buffer layer.

6. The organic light emitting diode of claim 9 wherein the anode layer is transparent or semitransparent, and the intrinsically conducting polymer is self-doped polyaniline.

7. The organic light emitting diode of claim 5 wherein the intrinsically conducting polymer is selected from the group consisting of polypyrrole, polyaniline, polythiophene, polyacetylene, and derivatives and blends thereof.

8. The organic light emitting diode of claim 5 wherein the intrinsically conducting polymer is sulfonated polyaniline.

9. The organic light emitting diode of claim 5 wherein the device exhibits a voltage increase of less than 15% over a period of 100 hours of operation at a constant density current.

10. The organic light emitting diode of claim 5 wherein the intrinsically conducting polymer is blended with another polymer.

* * * * *

UNITED STATES PATENT AND TRADEMARK OFFICE
CERTIFICATE OF CORRECTION

PATENT NO. : 6,611,096 B1
DATED : August 26, 2003
INVENTOR(S) : McCormick, Fred B.

It is certified that error appears in the above-identified patent and that said Letters Patent is hereby corrected as shown below:

<u>Title page,</u>
Item [56], References Cited, U.S. PATENT DOCUMENTS, insert the following:
-- 5,504,183    04/1996        Shi et al.
6,235,414        05/2001        Epstein et al. --.

<u>Column 12,</u>
Line 9, "9" should read as -- 5 --.

Signed and Sealed this

Second Day of March, 2004

JON W. DUDAS
*Acting Director of the United States Patent and Trademark Office*